United States Patent [19]
Suzuki et al.

[11] Patent Number: 5,171,936
[45] Date of Patent: Dec. 15, 1992

[54] HOUSING STRUCTURE FOR ACCOMMODATING ELECTRONICS APPARATUS

[75] Inventors: Toshiaki Suzuki; Eiji Suzuki, both of Kawasaki, Japan

[73] Assignee: Fujitsu Limited, Kawasaki, Japan

[21] Appl. No.: 778,543

[22] Filed: Oct. 18, 1991

[30] Foreign Application Priority Data

Oct. 20, 1990 [JP] Japan ................. 2-283219

[51] Int. Cl.$^5$ ............................................. H05K 9/00
[52] U.S. Cl. ............................ 174/35 MS; 174/35 R; 361/424
[58] Field of Search ................. 174/35 R, 35 MS; 361/424; 219/10.55 D, 10.55 R

[56] References Cited
U.S. PATENT DOCUMENTS
5,063,273 11/1991 Bloks ................................. 174/35 R

*Primary Examiner*—Leo P. Picard
*Assistant Examiner*—Bot Lee Ledynh
*Attorney, Agent, or Firm*—Nikaido, Marmelstein, Murray & Oram

[57] ABSTRACT

A box-like housing for an electronics apparatus is provided having superior effects for preventing problems caused by ESD. The wall of the housing is formed by a sandwiched plate consisting of the innermost layer (1) of high electro-conductive material such as a steel plate, the middle layer (2) of electro-insulating material such as plastic, and the outermost layer (3) of low electro-conductive material having much higher resistance compared with the innermost layer (1) such as a carbon-containing paint coating. The innermost layer (1) and the outermost layer (3) are frame-grounded through a common earth line.

(FIG. 1).

13 Claims, 4 Drawing Sheets

HOUSING STRUCTURE FOR ACCOMMODATING ELECTRONICS APPARATUS

BACKGROUND OF THE INVENTION

1. Field of the Invention

The present invention relates to a housing structure for accommodating electronics apparatus or circuit.

2. Description of the Related Arts

Recently, electronics apparatus have often been installed in an environment in which it can easily pick up an electrostatic charge. For example, service personnel may become electrostatically charged when they walk on a carpet covering the office floor to approach the electronics apparatus. Then an electrostatic discharge occurs between the human body and the apparatus to be attended when the service personnel touches the latter, which results in the erroneous operation of the apparatus and/or a system including the same.

Accordingly, there has long been an eager desire for a housing for accommodating the electronics apparatus, providing less probability of erroneous operation of the apparatus therein and/or a system including the same, even though the charged human body touches the housing; in other words, a housing ensuring the stable operation of the electronics apparatus accommodated therein.

One example of prior art housings is illustrated in FIGS. 5 and 6. In general, the housing 20 is made of highly electro-conductive material such as metal, typically a steel plate, and frame-grounded (hereinafter referred to as "FG"). It encircles the electronics apparatus to protect the same from damages caused by being subject to an electrostatic discharge (hereinafter referred to as "ESD"). The housing also serves for mitigating electromagnetic interference (hereinafter referred to as "EMI") and for securing the safety of the contained apparatus. In this connection, a printed circuit board 4 constituting the electronics apparatus is suitably signal-grounded (hereinafter referred to as "SG").

EMI is defined by the International Electric Standard Conference as "EMI is phenomena in which a reception of a desired electromagnetic signal is disturbed by unnecessary electromagnetic signals or noises". The ground system of an electronics apparatus is usually divided into two subsystems; the aforesaid FG and SG for determining a zero potential level of the electronics circuit; in practice, both the subsystems being interconnected with each other at a certain point and grounded together.

The process of electrostatic discharge to such metallic housing will be explained by the drawings as follows:

FIG. 6(c) is an equivalent circuit for the explanation of ESD, in which the lefthand side from a dotted line shows a human body replaced by a condenser $C_1$ and a resistor $R_1$ connected in series and the righthand side shows a metallic housing directly frame-grounded.

Now assume that the voltage charged in the condenser $C_1$ is 10 kV due to the electrostatic charge of human body and the resister $R_1$ has a value of 150 Ω. ESD occurs when the human body touches the metallic housing accompanying a large electric current flowing to FG. Such electric current has a maximum value, for example, of 67 A which is decreased by half after 10 ns, as shown in FIG. 6(a).

In the metallic housing 20, a printed circuit board 4 on which electronic circuits are formed is accommodated and connected to SG, as shown in FIG. 5.

As stated above, a larger electric current flows in the housing when ESD has occurred, which emits a powerful electromagnetic wave as well as creates a potential difference between points a and b on the metallic housing, as shown in FIG. 6(b), because the impedance thereof is not zero. This potential difference causes the FG potential level to fluctuate. Accordingly, the electronics circuits formed on the printed circuit board within the housing are affected by the electromagnetic wave thus emitted and further, when FG and SG are connected with each other, the zero level of the printed circuit board fluctuates due to the variation of FG potential level, which of course increases the probability of erroneous operation of the circuits.

In this connection, the definition of erroneous operation includes the following, which are different due to the functions of the respective apparatuses:

1. Damage of a CPU itself, or misoperation of a CPU out of the programmed routine, and noise on a display, in the case of an information apparatus.
2. Deterioration of transmitted signals or mistransmission of signals in the case of a communication apparatus.
3. Damage of electronic devices in the case of a domestic electric apparatus.

Particularly, in a communication apparatus having a high speed digital transmission function, an erroneous operation is defined by a bit error and electronics parts used therein become sensitive and easily affected by ESD because they are small-sized and of a lower energy comsumption type.

To prevent such ESD troubles, the following countermeasures are taken in the prior art.

1. The impedance of the ground system of the electronics apparatus including SG and FG is lowered to decrease the abovesaid fluctuation of the FD potential.
2. The electromagnetic wave generated by ESD is shielded to mitigate its influence on the electronic circuits.
3. Electronic parts and circuit structures having excellent noise durability are selected so that they can normally operate without error even though the noise occurs as a result of the fluctuation of FG potential due to ESD.

These countermeasures, however, are not satisfactorily effective even when all of them are adopted in combination, for the high speed digital communication apparatus which is evaluated by a severe test standard, for example, no bit error is permitted for 10 kV ESD.

SUMMARY OF THE INVENTION

Thus the object of the present invention is to provide a novel housing structure for accommodating an electronics apparatus, having a better durability against electrostatic discharge.

This object is achieved by a housing structure for accommodating an electronics apparatus, having a box-like shape formed by walls, characterized in that the wall comprises three layers; an innermost layer of high electro-conductive material, a middle layer of electro-insulating material, and an outermost layer of low electro-conductive material having much higher resistance compared to the innermost layer; integrally laminated together in a sandwich manner, and in that the innermost layer and the outermost layer are frame-grounded through a common earth line.

Preferably the innermost layer is formed of metal, and the outermost layer is formed a carbon-containing material.

Preferably the innermost layer is formed by metal plating.

Preferably the electro-insulating material is plastic.

BRIEF DESCRIPTION OF THE DRAWINGS

This and other objects of the present invention will be more apparent from the following description with reference to the drawings illustrating the preferred embodiments of the present invention; wherein

FIG. 6(c) is an equivalent circuit of a human body and a conventional housing structure when ESD occurs;

DESCRIPTION OF THE PREFERRED EMBODIMENTS

Figure 1:
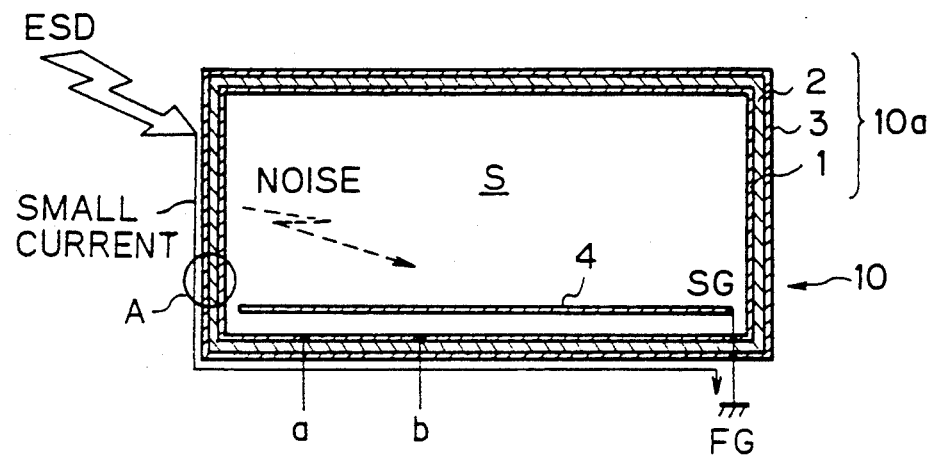
FIG. 1 is a schematic view of an elevational section of a housing structure for explaining the principle of the present invention.
Figure 2:
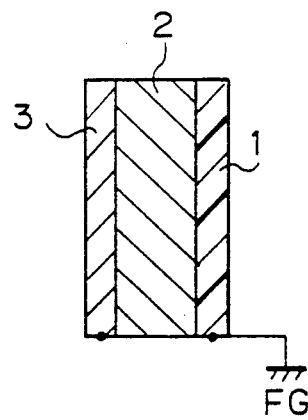
FIG. 2 is an enlarged view of A area of FIG. 1, illustrating a cross-section of a housing wall.

In FIG. 1, a housing 10 of the present invention is formed in a box-like shape by walls 10a so that a hollow space S is provided therein. The wall 10a is made of a sandwiched sheet comprising three layers 1, 2 and 3 integrally laminated, with each other. The innermost layer 1 is formed of high conductive material, such as metal, typically a steel plate, so that a resistance thereof is less than 1 $\Omega$. The middle layer 2 is formed of electro-insulating material, such as plastic, typically a polyacrylic resin plate, so that a resistance thereof is more than $10^6$ $\Omega$. The outermost layer 3 is formed of a low conductivity material having a much higher resistance compared to the innermost layer 1, such as in a range of from $10^2$ $\Omega$ to $10^5$ $\Omega$. In this embodiment, the outermost layer 3 is a coating of carbon-containing paint applied on the middle layer 2 which is adjusted to have a surface resistance in a range of 3 k$\Omega$ through 10 k$\Omega$. These three layers 1, 2 and 3 are laminated in a sandwiched manner, as shown in FIG. 2.

A printed circuit board 4, constituting an electronics apparatus accommodated in the housing 10 is signal-grounded through the innermost layer 1. While, the outermost layer 3 together with the innermost layer 1 are frame-grounded.

When an electrostatic discharge occurs between a human body and the housing, an electric current flows through the outermost layer 3 but the current value is small because of the higher resistance of the outermost layer 3. Further, the discharge voltage is lowered by an amount of capacity inherent to the outermost layer 3, the capacity of which is relatively large because the layer 3 has a higher permeability.

The discharge does not occur in the innermost layer 1 when high voltage is applied to the outermost layer 3 because the apparent resistance of the inner layer 1 increases due to the intervention of the insulating middle layer 2. Accordingly, the generation of an electromagnetic wave caused by current flowing on housing surface, or by a spark discharge, is limited to a greater extent compared with the prior art housing made of a simple mono-layered metal sheet.

The outermost layer 3 and the innermost layer 1 are frame-grounded through a common earth line, but the fluctuation of FG potential level is small because less current flows on the wall surface of the housing.

In conclusion, the principle of the present invention is far different from that of the prior art in that the conventional countermeasures for ESD is based on the improvement of the durability of electronic parts or circuits against the electromagnetic noise and the fluctuation of FG potential level upon the generation of ESD, while the present invention aims to lower the intensity of electromagnetic wave and the fluctuation of the FG potential level.

Figure 3A:
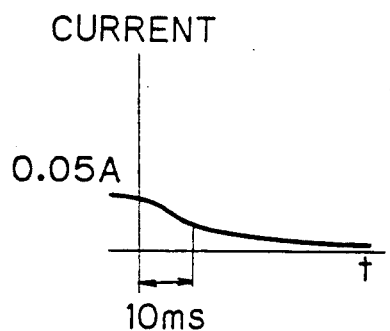
FIG. 3(a) is a graph illustrating a change of current value flowing on the housing surface.
Figure 3B:
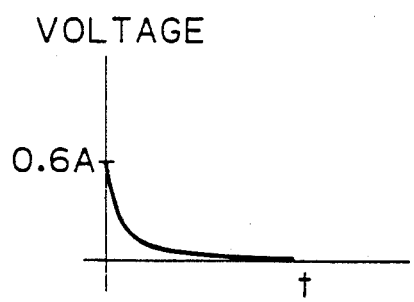
FIG. 3(b) is a graph illustrating a fluctuation of FG/SG potential level between points a and b.
Figure 3C:
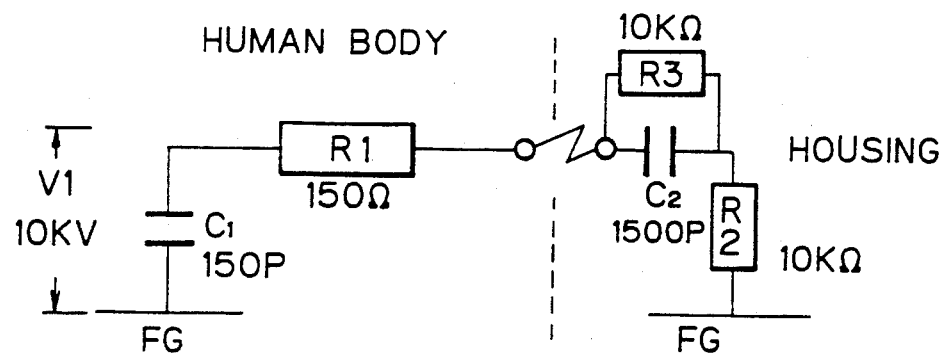
FIG. 3(c) is an equivalent circuit of a human body and a housing structure when ESD occurs.
Figure 6A:
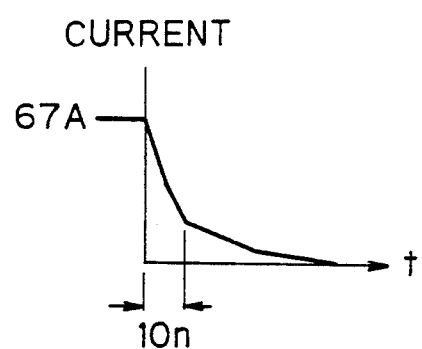
FIG. 6(c) is a graph illustrating a change of current value flowing on the conventional housing surface.
FIG. 6(b) is a graph illustrating a fluctuation of FG/SG potential level between points a and b on the conventional housing.
Figure 6B:
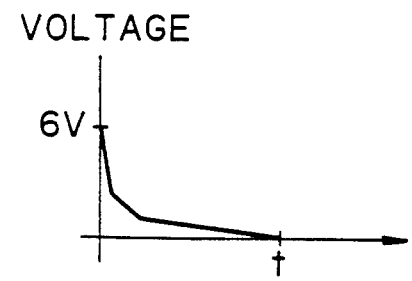
Figure 6C:
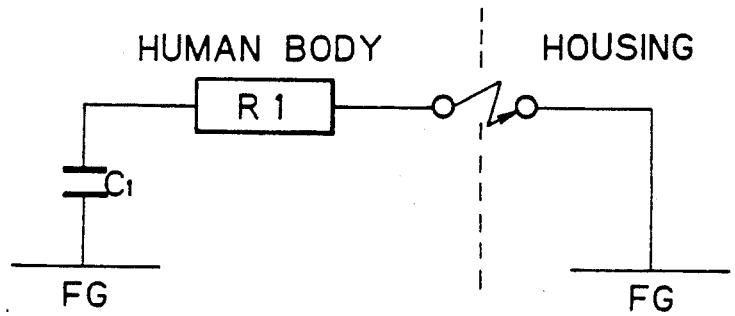

The operation of this housing will be explained in more detail with reference to FIGS. 3(a) through 3(c) as follows:

FIG. 3(c) illustrates a circuit which is equivalent to the human body and the surface of the housing including the outermost layer 3 and the middle insulating layer 2. The voltage $V_1$ charged in a condenser $C_1$ when the human body is statically charged is assumed to be 10 kV as stated before in FIG. 6(c) of the conventional housing. Condensers $C_1$ and $C_2$ are assumed to have a capacity of 150 pf and 1500 pf, respectively. Also, resistors $R_1$, $R_2$ and $R_3$ are assumed to have a resistance of 150 $\Omega$, 10 k$\Omega$, and 10 k$\Omega$, respectively.

Theoretically, the static charge Q stored in condenser $C_1$ is calculated as $C_1 \times V_1 = 1.5 \times 10^{-6}$. If all of this charge is transferred to condenser $C_2$, a voltage $V_2$ between the opposite ends of resistor $R_3$ becomes $V_2 = Q/C_2 = 1$ kV.

The current I varies in accordance with resistance $R_2 + R_3$ by a formula of $I = V_1/(R_2 + R_3)$ and in this case the maximum value of I is at most 0.05 A, as shown in FIG. 3(a). In this connection, a half value period is approximately 10 ms.

Accordingly, since only a smaller current flows on the surface of the housing upon the occurrence of ESD, as shown in FIG. 3(a), a correspondingly weak electromagnetic wave is generated therefrom and further the potential difference between points a and b on the innermost layer 1 is very small, for example, 0.6 V, which causes substantially no influence on FG potential level.

In addition, since the innermost layer 1 is formed of a highly conductive material such as metal, EMI due to spark discharge and other causes can also be mitigated.

In the above embodiment, a steel plate is used as the innermost layer 1 of highly conductive material, but it may be replaced by a plate of another metal, or a metal coating formed by plating on the middle layer 2. Similarly, the carbon paint used for forming the outermost layer 3 may be replaced by another material provided the latter has a resistance on the order of several k$\Omega$ as well as a certain capacity value. Also, the middle insulating layer 2 may be any material having an insulating resistance of more than $10^6$ $\Omega$.

The conventional housing made a simple metal plate can be modified to be durable against ESD, according to the present invention, as follows:

1. A carbon-contained plastic sheet with a thickness of more than 1 mm and having an electro-resistance in a range of from $10^2 \Omega$ to $10^5 \Omega$ is bonded onto the outer surface of the metal plate by an electro-conductive adhesive.

2. An insulating plastic sheet, has a carbon-contained paint disposed thereon so that the coating has an electro-resistance in a range of from $10^2 \Omega$ to $10^5 \Omega$, is bonded onto the outer surface of the metal plate by an electro-conductive adhesive.

According to another embodiment, the housing may be formed by a plastic plate coated on the outer surface thereof by a carbon-contained paint and on the inner surface thereof by an electro-conductive paint.

Figure 4:
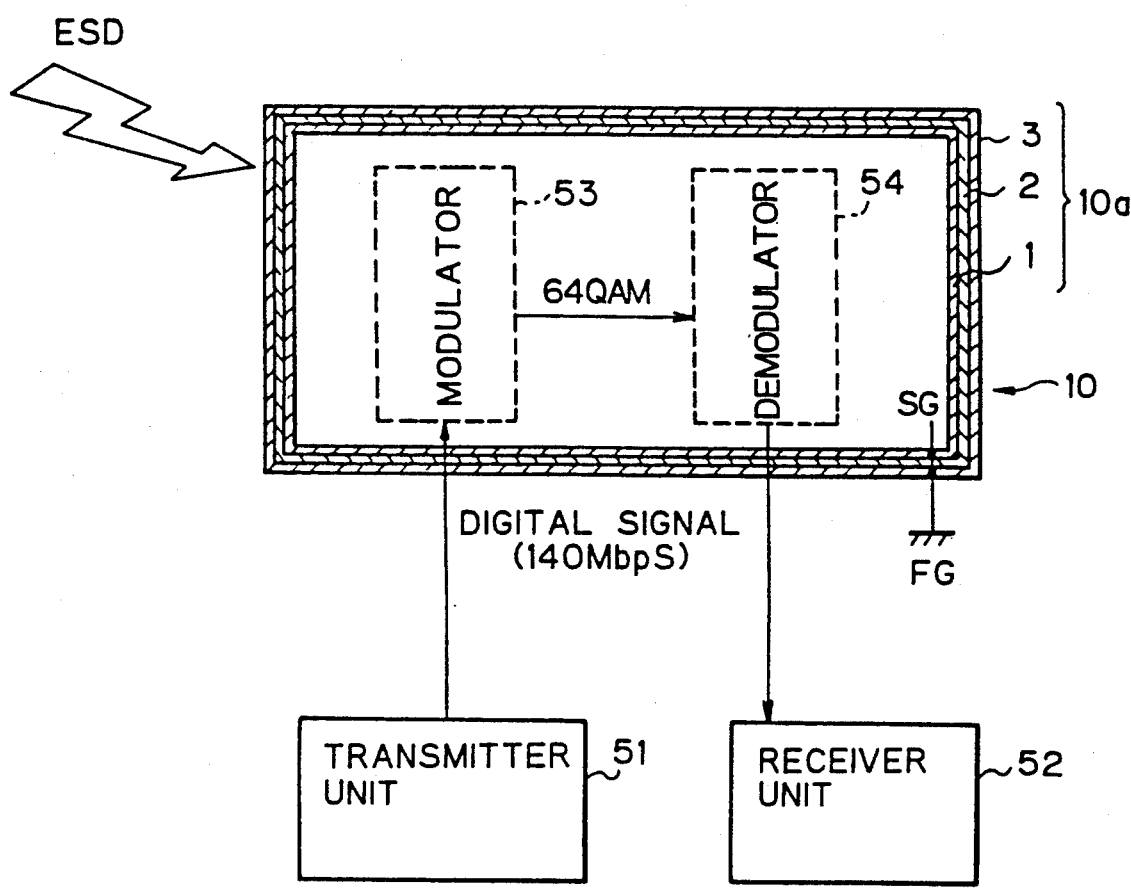
FIG. 4 is a schematic view of a measurement system for evaluating the effects of the present invention.
Figure 5:
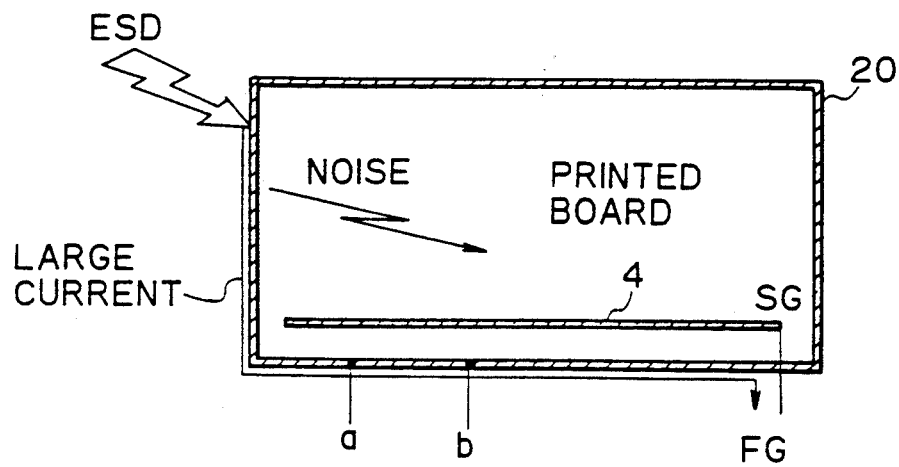
FIG. 5 is a schematic view of an elevational section of a conventional housing structure.

Effects of the housing described above were estimated by using a transmission error detecting instrument, as shown in FIG. 4, comprising a transmitter unit 51 and a receiver unit 52, while accommodating in the housing a pair of modulators 53 and demodulator 54 for 64QAM. Digital signals of 140 Mb/s were transmitted from the transmitter unit 51 to the modulator 53 in which the signals are modulated 64QAM modulation wave. The modulation wave is then transmitted to the demodulator 54 where it is demodulated and transmitted to the receiver unit 52 after reproduced as digital signals. The receiver unit 52 compared the original digital signals with the reproduced digital signals and determined the bit error. The results thereof was as follows:

1. ESD voltage at which the bit error was initially detected is 15 kV.

2. ESD voltage at which the frame synchronization was initially out is 20 kV.

Similar tests were conducted by using the conventional housing made of simple steel sheet, the results thereof being as follows:

1. The bit error ESD voltage was 1 kV.

2. The out of frame synchronization ESD voltage was 2 kV.

As described above, according to the present invention, a housing structure for accommodating an electronics apparatus is provided, which has superior effects for preventing the electronics apparatus from an operation error and a damage due to ESD.

We claim:

1. A structure for housing an electronics apparatus, the walls of which comprise integrally laminated layers comprising: an innermost layer of highly electro-conductive material, a middle layer of electro-insulating material, and an outermost layer of low electro-conductive material having much higher resistance than the innermost layer and a lower resistance than the middle layer; and wherein the innermost layer and the outermost layer are frame-grounded through a common earth line.

2. A housing structure as defined by claim 1, characterized in that the innermost layer is metal.

3. A housing structure as defined by claim 1, characterized in that the outermost layer is a carbon-containing material.

4. A housing structure as defined by claim 1, characterized in that the innermost layer is formed by metal plating.

5. A housing structure as defined by claim 1, characterized in that the middle layer is plastic.

6. A housing structure as defined by claim 1, wherein said outermost layer comprises carbon containing paint disposed on a plastic middle layer and said middle layer is bonded onto the outer surface of an innermost metal plate.

7. A housing structure as claimed in claim 1 wherein the resistance of said innermost layer is less than 1 ohm.

8. A housing structure as claimed in claim 1 wherein the resistance of said middle layer is more than $10^6$ ohm.

9. A housing structure as claimed in claim 1 wherein the resistance of said outer layer is about $10^2$ to $10^5$ ohm.

10. A housing structure as claimed in claim 1 wherein said innermost layer comprises steel.

11. A housing structure as claimed in claim 1 wherein said middle layer comprises a polyacrylic resin.

12. A housing structure as claimed in claim 1 wherein said outer layer comprises conductive carbon containing paint applied to the outer surface of said middle layer.

13. A housing structure as claimed in claim 1 wherein said innermost layer comprises steel having a resistance of less than about 1 ohm, said middle layer comprises a polyacrylic resin having a resistance of more than $10^6$ ohms, and said outer layer comprises carbon paint having a resistance of about 3,000 to 10,000 ohms.

* * * * *